United States Patent
Bi et al.

(10) Patent No.: US 10,096,524 B1
(45) Date of Patent: Oct. 9, 2018

(54) SEMICONDUCTOR FIN PATTERNING TECHNIQUES TO ACHIEVE UNIFORM FIN PROFILES FOR FIN FIELD EFFECT TRANSISTORS

(71) Applicant: International Business Machines Corporation, Armonk, NY (US)

(72) Inventors: Zhenxing Bi, Niskayuna, NY (US); Kangguo Cheng, Schenectady, NY (US); Juntao Li, Cohoes, NY (US); Peng Xu, Sunnyvale, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/786,744

(22) Filed: Oct. 18, 2017

(51) Int. Cl.
| | |
|---|---|
| H01L 21/8238 | (2006.01) |
| H01L 27/092 | (2006.01) |
| H01L 21/306 | (2006.01) |
| H01L 21/762 | (2006.01) |

(52) U.S. Cl.
CPC .......... *H01L 21/823821* (2013.01); *H01L 21/30604* (2013.01); *H01L 21/76224* (2013.01); *H01L 21/823878* (2013.01); *H01L 27/0924* (2013.01)

(58) Field of Classification Search
CPC ..... H01L 21/823821; H01L 21/823878; H01L 21/30604; H01L 21/762274; H01L 27/0924
See application file for complete search history.

(56) References Cited

U.S. PATENT DOCUMENTS

| | | | |
|---|---|---|---|
| 6,762,483 B1 | 7/2004 | Krivokapic et al. | |
| 7,315,994 B2 | 1/2008 | Aller et al. | |
| 8,263,462 B2 | 9/2012 | Hung et al. | |
| 8,729,634 B2 | 5/2014 | Shen et al. | |
| 8,941,153 B2 | 1/2015 | Lee et al. | |
| 9,087,725 B2 | 7/2015 | Lee et al. | |
| 9,159,576 B2 | 10/2015 | Song | |
| 9,190,329 B1 * | 11/2015 | Cheng | H01L 21/823821 |
| 9,324,792 B1 | 4/2016 | Cao et al. | |
| 9,391,077 B2 | 7/2016 | Cheng et al. | |
| 9,431,306 B2 | 8/2016 | Jacob et al. | |
| 9,431,523 B2 * | 8/2016 | Cheng | H01L 29/66818 |
| 2004/0197975 A1 | 10/2004 | Krivokapic et al. | |

(Continued)

*Primary Examiner* — Christine Enad
(74) *Attorney, Agent, or Firm* — Vazken Alexanian; Ryan, Mason & Lewis, LLP

(57) ABSTRACT

Methods are provided for fabricating semiconductor fins having uniform profiles. For example, a method includes forming semiconductor fins on a substrate, including a first semiconductor fin disposed in a first device region, and a second semiconductor fin disposed in a second device region. The first and second semiconductor fins are formed of different types of semiconductor material, and are initially formed to have different widths and heights. A semiconductor fin trimming process is performed, which is selective to the semiconductor material of the second semiconductor fin, so that the fin trimming process results in the formation of semiconductor fins having substantially equal heights and equal widths across the device regions as a result of the fin trimming process. The semiconductor fins in different device regions are initially formed with non-uniform profiles (e.g., differential heights and widths) to compensate for microloading and etch rate variations during the fin trimming process.

19 Claims, 6 Drawing Sheets

(56) References Cited

U.S. PATENT DOCUMENTS

| | | |
|---|---|---|
| 2008/0128797 A1 | 6/2008 | Dyer et al. |
| 2012/0313169 A1* | 12/2012 | Wahl ............... H01L 21/823431 |
| | | 257/347 |
| 2013/0334606 A1 | 12/2013 | Shen et al. |
| 2015/0200276 A1* | 7/2015 | Cheng ............... H01L 29/66818 |
| | | 257/401 |
| 2016/0035872 A1* | 2/2016 | Loubet .................. H01L 29/785 |
| | | 257/347 |

* cited by examiner

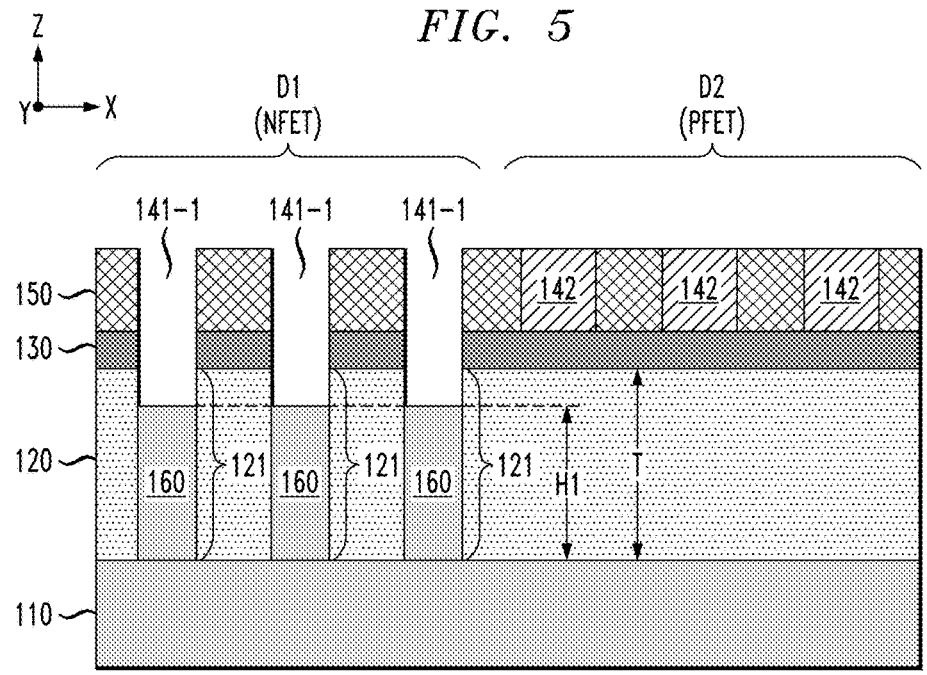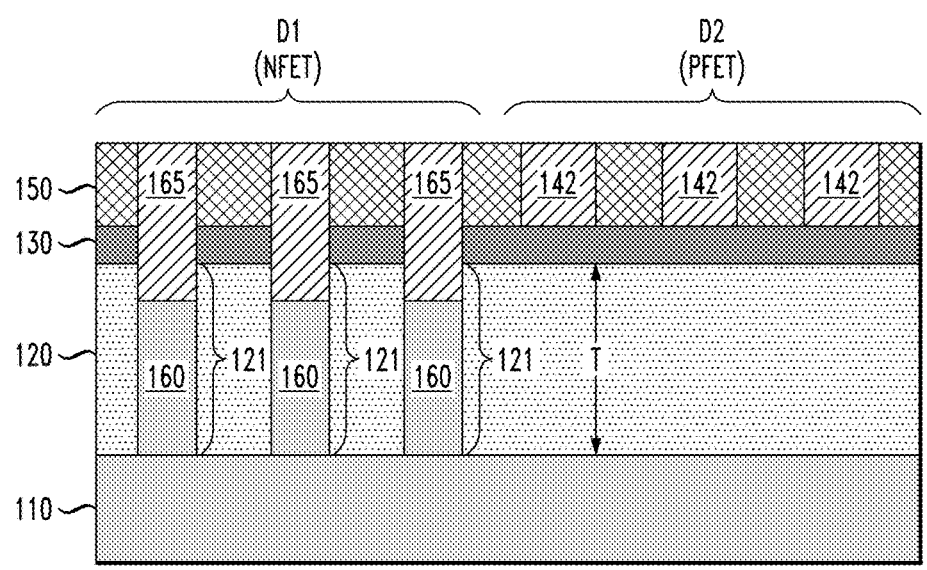

SEMICONDUCTOR FIN PATTERNING TECHNIQUES TO ACHIEVE UNIFORM FIN PROFILES FOR FIN FIELD EFFECT TRANSISTORS

TECHNICAL FIELD

This disclosure generally relates to semiconductor fabrication techniques and, in particular, techniques for fabricating FET (field effect transistor) devices.

BACKGROUND

As semiconductor manufacturing technologies continue to evolve toward smaller design rules and higher integration densities (e.g., 14 nm technology node and beyond), integrated circuit devices and components become increasingly smaller, creating challenges in layout formation and device optimization. Currently, FinFET technologies are typically implemented for FET fabrication, as such technologies provide effective CMOS scaling solutions for FET fabrication at, and below, the 14 nm technology node. A FinFET device comprises a three-dimensional fin-shaped FET structure which includes at least one vertical semiconductor fin structure formed on a substrate, a gate structure formed over a portion of the vertical semiconductor fin, and source/drain regions formed from portions of the vertical semiconductor fin extending from both sides of the gate structure. The portion of the vertical semiconductor fin that is covered by the gate structure between the source/drain regions comprises a channel region of the FinFET device.

The ability to fabricate vertical semiconductor fins having uniform profiles has proven to be challenging and non-trivial using current FinFET process technologies. For example, fin fabrication using standard multi-patterning methods such as sidewall image transfer (SIT), self-aligned double patterning (SADP), and self-aligned quadruple patterning (SAQP) techniques, for example, are problematic with regard to process control issues, which typically result in variations in the critical dimensions of mandrel and spacer features, and thereby resulting in semiconductor fin width variations. Furthermore, the use of dry etch plasma methods such as reactive ion etching (ME) to pattern semiconductor fins from semiconductor layers can be problematic as ME methods exhibit etch selectivity with regard to vertical semiconductor fins made of different materials (e.g., silicon (Si) for n-type FinFETS, and silicon germanium (SiGe) for p-type Fin-FETS), which results in fin width variations in different device regions.

Furthermore, there are limitations on the minimum semiconductor fin width which can be achieved (e.g., semiconductor fin width no less than 8-9 nm) using current semiconductor fin fabrication techniques based on SIT and ME. In some applications, however, it is desirable to fabricate semiconductor fins with thinner profiles (e.g., less than 8 nm) to enhance electrical properties of the FinFET devices (e.g., increase voltage threshold and decrease DIBL (drain-induced barrier lowering), etc.). To achieve thinner fin width profiles, a trimming process can be used to laterally etch the sidewalls of the vertical semiconductor fins to reduce fin width. However, current fin trimming techniques are also problematic with regard to their inability to achieve conformal trimming due to, e.g., different etch selectivities of the semiconductor fin materials, and micro-loading effects which result in a vertical etch rate of the semiconductor fin height which is greater than a lateral etch rate of the semiconductor fin width, which results in both unequal height and unequal widths of semiconductor fins.

SUMMARY

Embodiments of the invention generally include methods for fabricating vertical semiconductor fins having uniform profiles. For example, one embodiment includes a method for fabricating a semiconductor device, wherein the method comprises: forming a plurality of semiconductor fins on a substrate and performing a semiconductor fin trimming process to trim the plurality of semiconductor fins. The plurality of semiconductor fins comprises a first semiconductor fin disposed in a first device region, and a second semiconductor fin disposed in a second device region. The first semiconductor fin and the second semiconductor fin are formed of different types of semiconductor material, and are formed to have different widths and heights. The semiconductor fin trimming process is performed selective to the semiconductor material of the second semiconductor fin, to trim the first and second semiconductor fins to have substantially a same width and substantially a same height.

In another embodiment, a method for fabricating a semiconductor device, comprises:

patterning a layer of first epitaxial semiconductor material, which is disposed on a semiconductor substrate, to form a trench opening in the layer of first epitaxial semiconductor layer down to the semiconductor substrate, wherein the trench opening is formed in a first device region;

forming a first semiconductor fin in the trench opening, wherein the first semiconductor fin is formed of a second epitaxial semiconductor material which is different from the first epitaxial semiconductor material, wherein the first semiconductor fin is epitaxially grown in the trench opening using a bottom-up epitaxial growth process to partially fill the trench opening with the second epitaxial semiconductor material to a height of H1 which is less than a thickness T of the layer of first epitaxial semiconductor material, wherein a width of the trench opening defines a width W1 of the first semiconductor fin;

etching the layer of first epitaxial semiconductor material to form a second semiconductor fin in a second device region which comprises the first epitaxial semiconductor material, and to remove remaining portions of the layer of first epitaxial semiconductor material in the first and second device regions, wherein the second semiconductor fin is formed to have a width W2 which is greater than W1, and wherein a height H2 of the second semiconductor fin is defined by the thickness T of the layer of first epitaxial semiconductor material; and performing a semiconductor fin trimming process, which is selective to the first epitaxial semiconductor material of the second semiconductor fin, to trim the first and second semiconductor fins to have substantially a same width W3 and substantially a same height H3, wherein W3 is less than W2 and W1, and wherein H3 is less than H2 and H1.

Other embodiments will be described in the following detailed description of embodiments, which is to be read in conjunction with the accompanying figures.

BRIEF DESCRIPTION OF THE DRAWINGS

FIGS. 1-10 schematically illustrate a method for fabricating vertical semiconductor fins having uniform profiles, according to an embodiment of the invention, wherein:

FIG. 1 is a schematic cross-sectional side view of a semiconductor structure at an intermediate stage of fabrication in which a semiconductor fin pattern image is formed in first and second device regions of a semiconductor substrate;

FIG. 2 is a schematic cross-sectional side view of the semiconductor structure of FIG. 1 after filling spaces between the features of the semiconductor fin pattern image with an insulating fill material;

FIG. 3 is a schematic cross-sectional side view of the semiconductor structure of FIG. 2 after forming a block etch mask to cover the second device region, removing a first pattern of features of the semiconductor fin pattern image in the first device region, and etching exposed portions of a hardmask layer to form openings that expose an underlying epitaxial semiconductor layer;

FIG. 4 is a schematic cross-sectional side view of the semiconductor structure of FIG. 3 after etching exposed portions of the epitaxial semiconductor layer down to a substrate layer to form trenches in the epitaxial semiconductor layer in the first device region;

FIG. 5 is a schematic cross-sectional side view of the semiconductor structure of FIG. 4 after partially filling the trenches in the epitaxial semiconductor layer with epitaxial semiconductor material to form semiconductor fins in the first device region;

FIG. 6 is a schematic cross-sectional side view of the semiconductor structure of FIG. 5 after filling an upper portion of trenches and the openings with an insulting material to form insulating plugs;

FIG. 7 is a schematic cross-sectional side view of the semiconductor structure of FIG. 6 after etching away the insulating fill material selective to the insulating plugs and a second pattern of features of the semiconductor fin pattern image in the second device region;

FIG. 8 is a schematic cross-sectional side view of the semiconductor structure of FIG. 7 after performing a hardmask punch through and a directional dry etch process to pattern the epitaxial semiconductor layer and form semiconductor fins in the second device region;

FIG. 9 is a schematic cross-sectional side view of the semiconductor structure of FIG. 8 after removing the insulating plugs, the second pattern of features, and the remaining portions of the hardmask layer to expose the semiconductor fins in the first and second device regions; and FIG. 10 is a schematic cross-sectional side view of the semiconductor structure of FIG. 9 after performing a semiconductor fin trimming process to reduce the widths and heights of the semiconductor fins and generate uniform semiconductor fin profiles across the first and second device regions.

DETAILED DESCRIPTION

Figure 1:
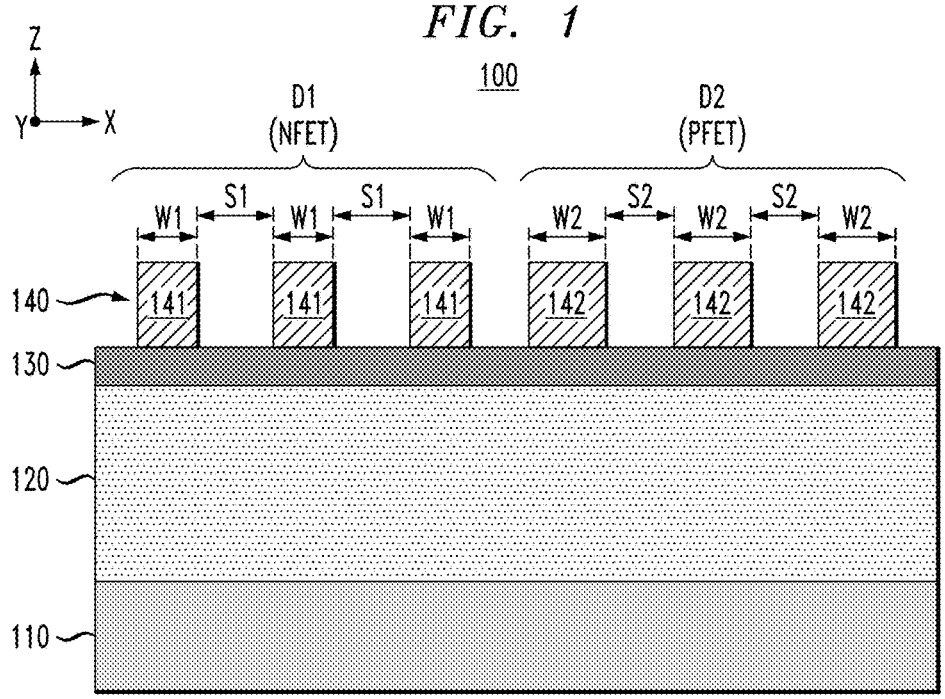

Embodiments will now be described in further detail with regard to methods for fabricating vertical semiconductor fins having uniform profiles. As explained in further detail below, methods for fabricating semiconductor fins with uniform profiles are implemented in process flows in which semiconductor fins for different FinFET devices (e.g., p-type, n-type) are formed with different types semiconductor materials in different device regions, and are initially formed to have different profiles (e.g., different widths and heights). A semiconductor fin trimming process is then performed to selectively etch the semiconductor fins, which are formed of different types of semiconductor materials (e.g., crystalline silicon, crystalline silicon-germanium), so that semiconductor fins, as trimmed, have substantially the same profile (e.g., the same width and height). In other words, the semiconductor fins in different device regions are initially formed with non-uniform profiles (e.g., differential heights and widths) to compensate for micro-loading and etch rate variations of the different materials that form the vertical semiconductor fins during a subsequent semiconductor fin trimming process, so that the fin trimming process results in the formation of semiconductor fins having substantially equal heights and equal widths across the device regions.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

To provide spatial context, XYZ Cartesian coordinates are shown in the drawings of semiconductor structures. It is to be understood that the term "vertical" as used herein denotes a Z-direction of the Cartesian coordinates shown in the drawings, and that the terms "horizontal" or "lateral" as used herein denotes an X-direction and/or Y-direction of the Cartesian coordinates shown in the drawings, which is perpendicular to the Z-direction.

FIGS. 1-10 schematically illustrate a method for fabricating vertical semiconductor fins having uniform profiles, according to an embodiment of the invention. To begin, FIG. 1 is a schematic cross-sectional view of a semiconductor structure 100 (along an X-Z plane) at an intermediate stage of fabrication in which an image 140 of a semiconductor fin pattern is formed in first and second device regions D1 and D2 of a semiconductor substrate comprising layers 110, 120, and 130. In particular, the semiconductor structure 100 comprises a base substrate layer 110, an epitaxial semiconductor layer 120 formed on the base substrate layer 110, and a hardmask layer 130 formed on the epitaxial semiconductor layer 120. The semiconductor fin pattern image 140 comprises a first pattern of features 141 formed in the first device region D1 (e.g., n-type FinFET region), and a second pattern of features 142 formed in the second device region D2 (e.g., p-type FinFET region).

In one embodiment, the base substrate layer 110 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In another embodiment, the base substrate layer 110 may be an active semiconductor layer of an SOI (silicon-on-insulator) substrate or a GeOI (germanium-on-insulator) substrate, which comprises an insulating layer (e.g., oxide layer) disposed between a base substrate layer (e.g., silicon substrate) and the active semiconductor layer (e.g., Si, Ge, etc.) in which active circuit components are formed as part of a FEOL (front end of line) structure. In each drawing, the X-Y plane represents a plane that is parallel to the plane of the semiconductor wafer being processed.

In the exemplary process flow discussed herein, the epitaxial semiconductor layer 120 is utilized to fabricate vertical semiconductor fins for p-type FinFETs in the second device region D2. In this regard, in one embodiment, the epitaxial semiconductor layer 120 is formed with a semiconductor material that it suitable for semiconductor fins of p-type FinFET devices. For example, in one embodiment, the epitaxial semiconductor layer 120 comprise a crystalline SiGe semiconductor layer that is epitaxially grown on top of the base semiconductor substrate layer 110. The crystalline SiGe semiconductor layer (or other types of epitaxial semiconductor layers) can be epitaxially grown using known techniques, such as CVD (chemical vapor deposition), MOCVD (metal-organic chemical vapor deposition), LPCVD (low pressure chemical vapor deposition), MBE (molecular beam epitaxy), VPE (vapor-phase epitaxy), MOMBE (metal organic molecular beam epitaxy), or other known epitaxial growth techniques.

Furthermore, the epitaxial semiconductor layer 120, which comprises a crystalline SiGe material formed by an epitaxial growth process, may comprise a relaxed SiGe layer or a strained SiGe layer. As is known in the art, strain engineering is utilized to enhance the carrier mobility for MOS transistors, wherein different types of Si—SiGe heterostructures can be fabricated to obtain and/or optimize different properties for CMOS FET devices. For example, silicon can be epitaxially grown on a SiGe substrate layer to form a strained Si layer. Moreover, a strained SiGe layer can be epitaxially grown on silicon substrate layer. A strained-Si/relaxed-SiGe structure produces tensile strain which primarily improves electron mobility for n-type FET devices, while a strained-SiGe/relaxed-Si structure produces a compressive strain which primarily improves hole mobility for p-type FET devices. In this regard, the epitaxial semiconductor layer 120 may comprise a compressively strained crystalline SiGe material to enhance the electrical characteristics of the p-type FinFET devices formed in the second device region D2.

The hardmask layer 130 may be formed of any material that is suitable for the given application. For example, in one embodiment, the hardmask layer 130 is formed of a silicon nitride (SiN), or other types of similar materials which have etch selectivity with respect to the surrounding materials.

The semiconductor fin pattern image 140 can be fabricated using any type of multi-patterning technique such as SIT, SADP, SAQP, etch. For example, the semiconductor fin pattern image 140 may be fabricated using a multi-patterning process which comprise (i) depositing a layer of sacrificial material on the hardmask layer 130, (ii) patterning the layer of sacrificial material to form a pattern of sacrificial mandrel features, (iii) depositing a conformal layer of mask material (e.g., silicon dioxide (SiO2)) over the sacrificial mandrel features, (iv) etching the conformal layer of mask material using an anisotropic etch-back process to form "spacer" features on the sidewalls of the sacrificial mandrel features, and then (v) etching away the sacrificial mandrel features selective to the spacer features and the hardmask layer 140 to form the semiconductor fin pattern image 140 shown in FIG. 1. The resulting semiconductor fin pattern image 140 comprises a plurality of features (e.g., $SiO_2$ features) that define the initial fin widths and fin spacing of vertical semiconductor fins that are formed in the device regions D1 and D2.

In particular, as shown in FIG. 1, the first pattern of features 141 of the semiconductor fin pattern image 140 are formed to have a width W1 and are spaced apart by spacing S1. The second pattern of features 142 of the semiconductor fin pattern image 140 are formed to have a width W2 and are spaced apart by a spacing S2. The width W1 represents an initial width of vertical semiconductor fins to be formed (before trimming) in the NFET region D1, and the width W2 represents an initial width of vertical semiconductor fins to be formed (before trimming) in the PFET region D2. In one embodiment, the initial width W1 is in a range of about 6 nm to about 10 nm, and the initial width W2 is in a range of about 8 nm to about 15 nm. In addition, the spacings S1 and S2 represent the initial spacing between vertical semiconductor fins in the respective device regions D1 and D2. In one embodiment, the values of S1 and S2 are in a range of about 10 nm to about 30 nm. In one embodiment, the initial spacings S1 and S2 are selected so that after fin trimming process, the semiconductor fins in the device regions D1 and D2 are spaced at a same pitch P (see FIG. 10). For example, the initial spacing S1 and S2 are selected so that S2 is less than S1, wherein a differential spacing (S1-S2) is in a range of about 4 nm to about 10 nm. To obtain the different widths W1/W2 and spacings S1/S2 of the features of the semiconductor fin pattern image 140, the first pattern of features 141 and the second pattern of features 142 are separately fabricated in the different device regions D1 and D2 using a same multi-patterning process, as is readily understood by one of ordinary skill in the art.

Figure 2:
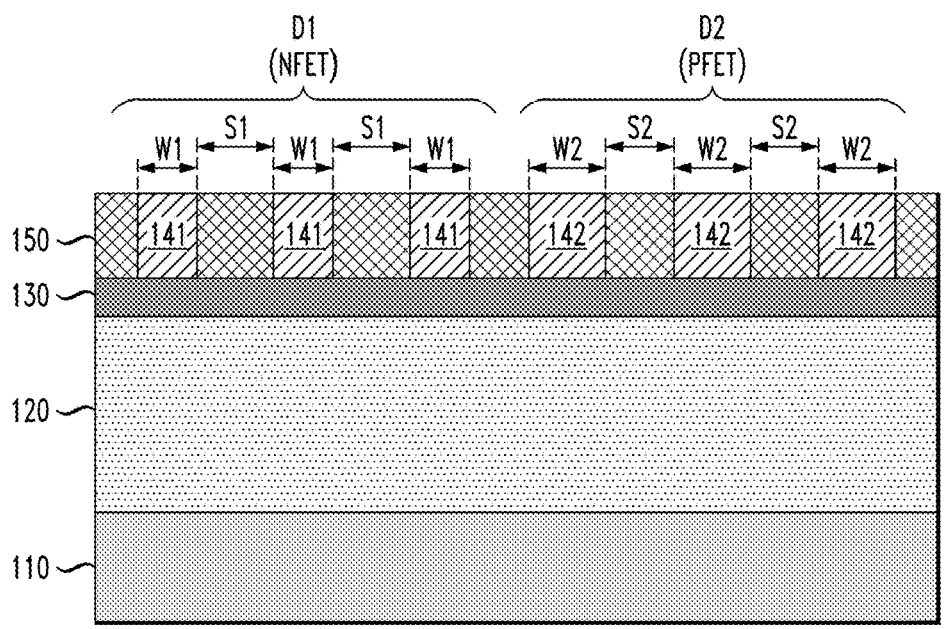

Next, FIG. 2 is a schematic cross-sectional side view of the semiconductor structure of FIG. 1 after filling spaces between the features of the semiconductor fin pattern image 140 with an insulating fill material 150. In one embodiment, the insulating fill material 150 comprises a material that has etch selectivity with respect to the material that forms the features of the semiconductor fin pattern image 140. For example, when the semiconductor fin pattern image 140 is formed of silicon oxide (e.g., SiO2), the insulating fill material 150 can be formed of silicon carbide (SiC). The insulating fill material 150 can be formed by depositing a layer of insulating material (e.g., SiC) to fill the spaces between the features of the semiconductor fin pattern image 140, followed by a suitable etch-back process (e.g., RIE) or a chemical-mechanical planarizing (CMP) process to remove the overburden material down to upper surfaces of the features 141, 142 of the semiconductor fin pattern image 140.

Figure 3:
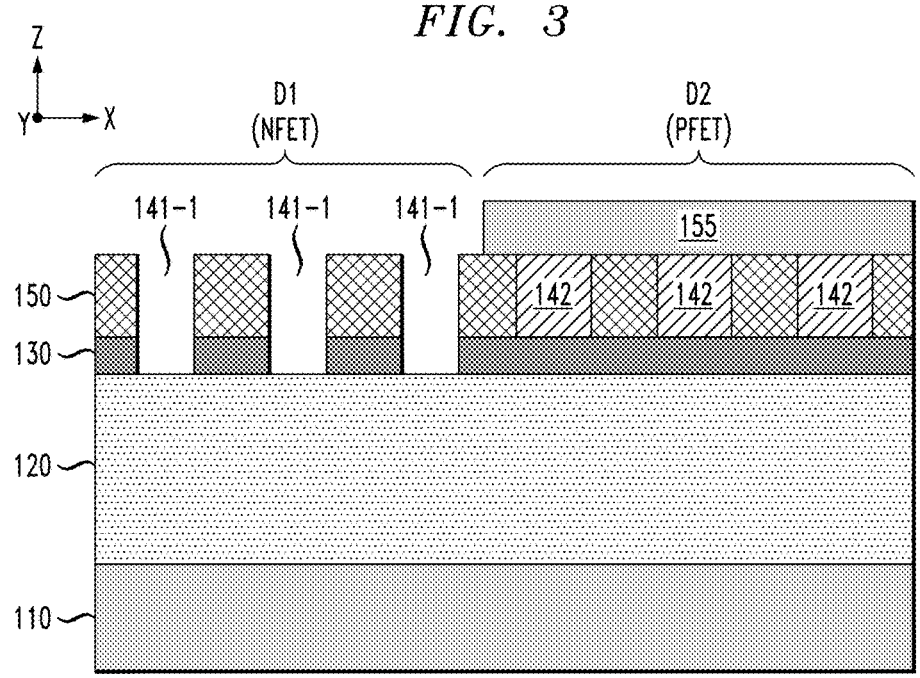
Figure 4:
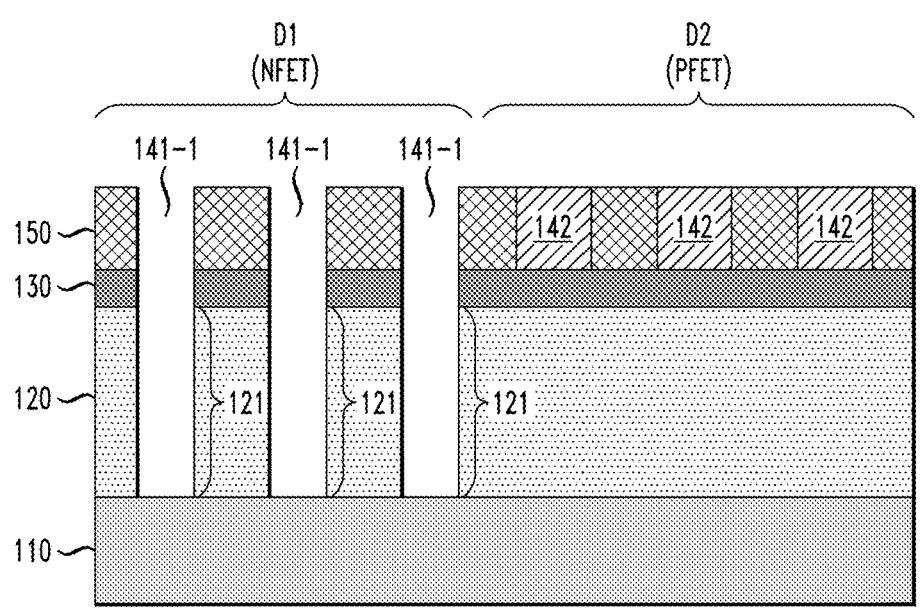

A next phase of the process flow comprises fabricating vertical semiconductor fins in the first device region D1, as schematically illustrated in FIGS. 3, 4 and 5. In particular, FIG. 3 is a schematic cross-sectional side view of the semiconductor structure of FIG. 2 after forming a block etch mask 155 to cover the second device region D2, removing the first pattern of features 141 of the semiconductor fin pattern image 140, and etching exposed portions of the hardmask layer 130 to form openings 141-1 that expose the underlying epitaxial semiconductor layer 120. The block etch mask 155 may be a photoresist mask that is formed using standard photolithographic techniques.

The first pattern of features 141 of the semiconductor fin pattern image 140 can be removed using a dry etch process (e.g., ME) with an etch chemistry that is configured to etch the material (e.g., silicon oxide) of the first pattern of features 141 selective to the insulating fill material 150 (e.g., SiC) to expose portions of the underling hardmask layer 130. The exposed portions of the hardmask layer 130 are then selectively etched away using an ME etch process with an etch chemistry that is selective to the material (e.g., SiN) of the hardmask layer 130. The resulting intermediate structure as shown in FIG. 3 comprises a pattern of openings 141-1 that expose portions of the underlying epitaxial semiconductor layer 120.

Next, FIG. 4 is a schematic cross-sectional side view of the semiconductor structure of FIG. 3 after etching exposed portions of the epitaxial semiconductor layer 120 down to the substrate layer 110, which results in the formation of high aspect-ratio trenches 121 formed in the epitaxial semiconductor layer 120 in the first device region D1. In one embodiment, the epitaxial semiconductor layer 120 is etched using a directional dry etch process, such as a deep ME (DRIE), which is suitable to form steep sidewall trenches 121 in the layer of epitaxial semiconductor material 120. The sidewall profiles of the trenches 121 define, in part, the sidewall profiles of vertical semiconductor fins that are subsequently formed, as shown in FIG. 5.

In particular, FIG. 5 is a schematic cross-sectional side view of the semiconductor structure of FIG. 4 after partially filling the trenches 121 in the epitaxial semiconductor layer 120 with an epitaxial semiconductor material to form an array of vertical semiconductor fins 160 in the first device region D1. In one embodiment of the invention, the vertical semiconductor fins 160 are formed using a bottom-up epitaxial growth process in which epitaxial growth of semiconductor material starts on the exposed surface of the base substrate layer 110 at the bottom of the trenches 121, and continues upward until a target fin height H1 is reached for the vertical semiconductor fins 160, wherein the fin height H1 is less than a thickness T of the epitaxial semiconductor layer 120.

The vertical semiconductor fins 160 can be epitaxially grown using known techniques, such as CVD, MOCVD, LPCVD, MBE, VPE, or other known epitaxial growth techniques which are suitable for the given process flow. The epitaxial growth is performed selectively so that epitaxial semiconductor material is not formed on the exposed upper surfaces of the insulating fill material 150 and the second pattern of features 142. The type of epitaxial semiconductor material that is used to form the vertical semiconductor fins 160 will vary depending on various factors such as, the device type (e.g., n-type or p-type) that is to be formed in the given device region D1, the lattice constant of the material of the base substrate layer 110, and other factors as is understood by those of ordinary skill in the art.

For example, in one embodiment of the invention, the vertical semiconductor fins 160 are formed of crystalline Si, which is suitable for n-type FinFET devices. The base substrate layer 110 is formed of a material which has a lattice constant which is the same or similar to the lattice constant of the semiconductor material (e.g., crystalline Si) used to form the vertical semiconductor fins 160, which serves to minimize mechanical stress and reduce lattice defects within the material of the vertical semiconductor fins 160 at the interface between the bottom portion of the vertical semiconductor fins 160 and the exposed surface of the base substrate layer 110. In one embodiment, assuming that the base substrate layer 110 is formed of crystalline Si or SiGe, for example, the substantially defect-free vertical semiconductor fins 160 can be formed by epitaxially growing crystalline Si on the surface of the base substrate layer 110.

Following formation of the vertical semiconductor fins 160 in the first device region D1, the unfilled portion of the openings above the vertical semiconductor fins 160 are filled with an insulating material. For example, FIG. 6 is a schematic cross-sectional side view of the semiconductor structure of FIG. 5 after filling an upper portion of trenches 121 and the openings 141-1 with an insulting material to form insulating plugs 165. In one embodiment, the insulating plugs 165 are formed of a same or similar material (e.g., silicon oxide) which is used to form the first and second feature patterns 141 and 142. In one embodiment, the insulating plugs 165 are formed using a process which comprises, e.g., depositing a layer of insulating material to fill the openings, followed by a CM' process to remove the overburden insulating material and planarize the surface of the semiconductor structure down to the upper surface of the SiC insulating layer 150, thereby resulting in the insulating plugs 165 shown in FIG. 6.

Figure 7:
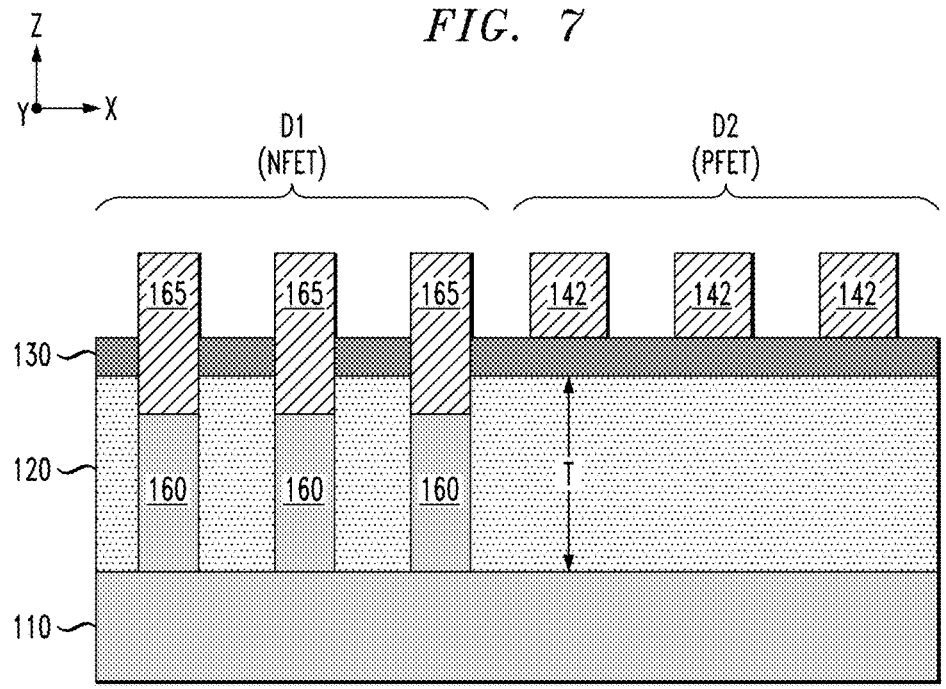
Figure 8:
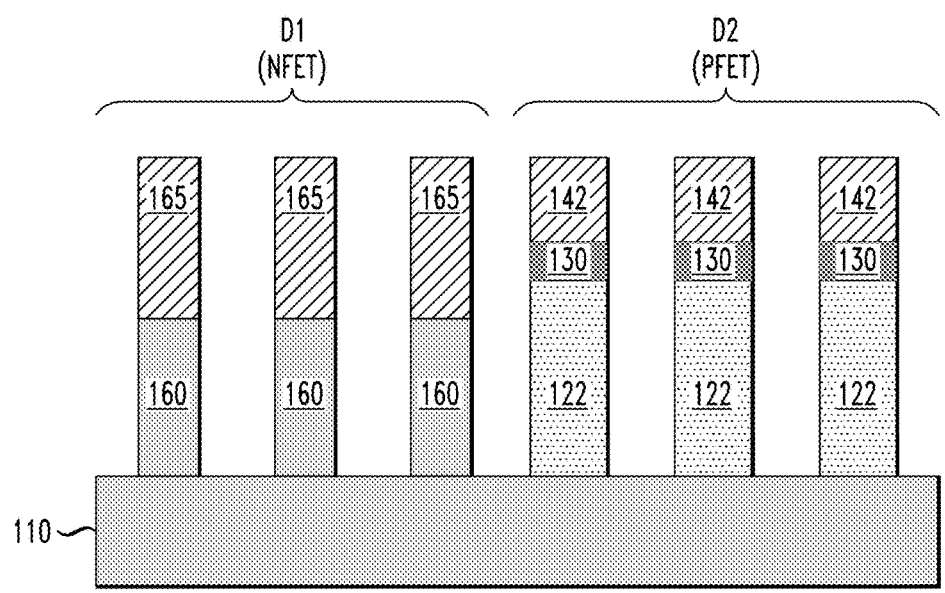
Figure 9:
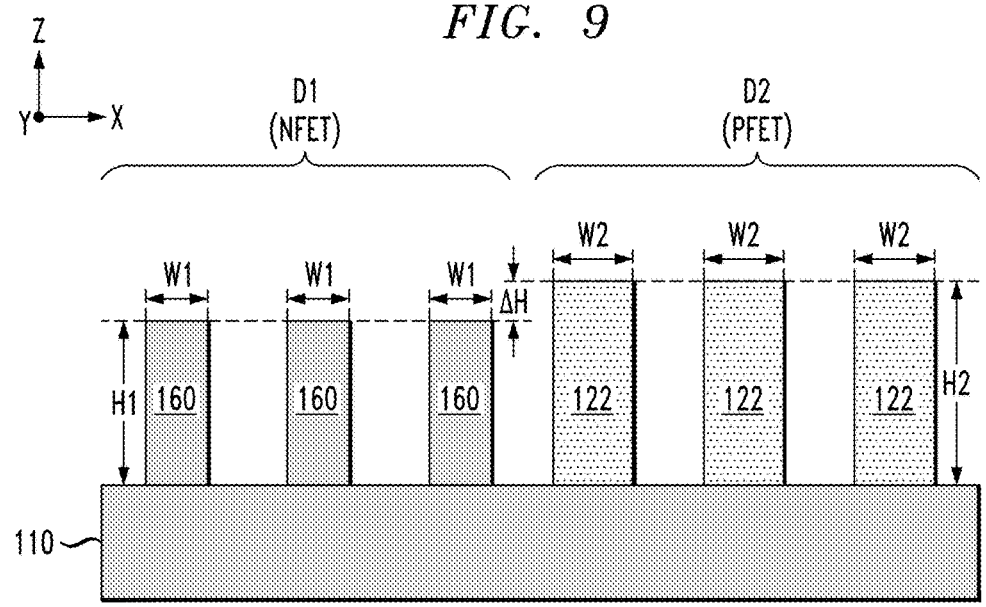

A next phase of the process flow comprises forming vertical semiconductor fins in the second device region D2, as schematically illustrated in FIGS. 7, 8, and 9. For example, as an initial step, FIG. 7 is a schematic cross-sectional side view of the semiconductor structure of FIG. 6 after etching away the SiC insulating fill material 150 selective to the insulating plugs 165 and the second pattern of features 142. The insulating fill material 150 can be removed using a wet or dry etch process with a suitable etch chemistry.

Next, FIG. 8 is a schematic cross-sectional side view of the semiconductor structure of FIG. 7 after performing a hardmask punch through and a directional dry etch process to pattern the epitaxial semiconductor layer 120 and form vertical semiconductor fins 122 in the second device region D2. The hardmask punch through can be performed by selectively etch portions of the hardmask layer 130, which are exposed in the spaces between the insulating plugs 165 and the second pattern of features 142 (as shown in FIG. 7) to form openings in the hardmask layer 130 which expose portions of the underlying epitaxial semiconductor layer 120. The exposed portions of the epitaxial semiconductor layer 120 are then etched using a directional RIE process (e.g., DRIE), which results in removal of the remaining epitaxial semiconductor layer 120 in the first region D1, and the formation of the vertical semiconductor fins 122 in the second device region D2, wherein the vertical semiconductor fins 122 comprise the remaining epitaxial material of the epitaxial semiconductor layer 120.

Following formation of the vertical semiconductor fins 122, the process flow continues with performing one or more etch processes to remove the insulating plugs 165, the second pattern of features 142, and the remaining portions of the hardmask layer 130, resulting in the intermediate structure shown in FIG. 9 with the vertical semiconductor fins 160 and 122 in the device regions D1 and D2 having different size profiles (e.g., different widths and heights). In particular, as shown in FIG. 9, the vertical semiconductor fins 160 in the first device region D1 have an average width W1 and a height H1, and the vertical semiconductor fins 122 in the second device region D2 have an average width W2 and a height H2. In the example embodiment, the average width W1 is less than the average width W2, and the height H1 is less than the height H2. The term "average width" refers to the fact that in practice, each semiconductor fin 160 and 122 would have a slightly sloped sidewall profile from the top to the bottom of the semiconductor fin. In this regard, the term "average width" of a semiconductor fin denotes a mean width of the semiconductor fin across its vertical height.

In the example embodiment of FIG. 9, the width W1 represents the initial width of vertical semiconductor fins 160 formed (before trimming) in the NFET region D1, and the width W2 represents the initial width of vertical semiconductor fins 122 formed (before trimming) in the PFET region D2. As noted above, the widths W1 and W2 of the semiconductor fins 160 and 122 are primarily defined by the widths W1 and W2 of the features of the image pattern 140 shown in FIG. 1. In one embodiment, the initial (average) width W1 of the semiconductor fins 160 is in a range of about 6 nm to about 10 nm, and the initial (average) width W2 of the semiconductor fins 122 is in a range of about 8 nm to about 15 nm, wherein a width differential (W2−W1) between the semiconductor fins 122 and 160 is in a range of about 1 nm to about 5 nm. In addition, a height differential ΔH (H2−H1) between the semiconductor fins 122 and 160 is in a range of about 5 nm to about 10 nm.

The non-uniform profile (e.g., differential heights and differential widths) between the vertical semiconductor fins 122 and 160 (as shown in FIG. 9) is purposefully designed to compensate for micro-loading and etch rate variations of the materials that form the vertical semiconductor fins 122 and 160 during a subsequent semiconductor fin trimming process, so that the fin trimming process results in the semiconductor fins 122 and 160 having substantially equal heights and substantially equal widths across the device regions D1 and D2. For example, FIG. 10 is a schematic cross-sectional side view of the semiconductor structure of FIG. 9 after performing a semiconductor fin trimming process to reduce the widths and heights of the semiconductor fins 122 and 160 and generate uniform semiconductor fin profiles of the trimmed semiconductor fins 122 and 160 across the device regions D1 and D2.

Figure 10:
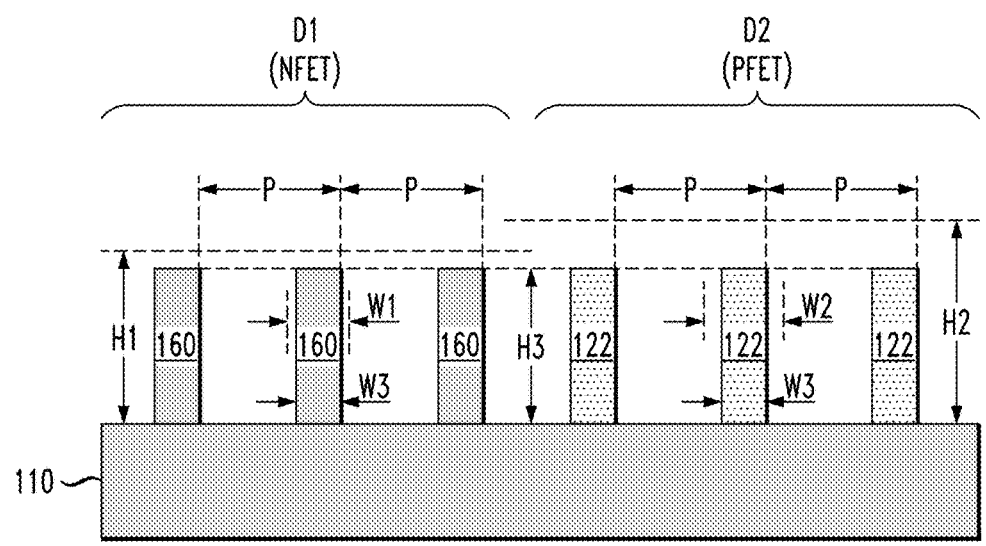

In particular, as schematically shown in FIG. 10, the semiconductor fin trimming process results in (i) a reduction in the initial average widths W1 and W2 of the semiconductor fins 160 and 122 so that the semiconductor fins 122 and 160 have a substantially equal (average) width W3, and (ii) a reduction in the heights H1 and H2 of the semiconductor fins 160 and 122 so that the semiconductor fins 122 and 160 have a substantially equal height H3. As further illustrated in FIG. 10, the semiconductor fin trimming process results in the formation of trimmed semiconductor fins 160 and 122 having substantially the same pitch P across the device regions D1 and D2.

In one embodiment, the width W3 is in a range of about 5 nm to about 7 nm, and the height H3 is in a range of about 50 nm to 100 nm. In one embodiment, the semiconductor fin trimming process is implemented using an isotropic etch process (e.g. isotropic RIE) with an etch chemistry that is selective to the material (e.g., SiGe) of the vertical semiconductor fins 122 to compensate for different etch selectivities of the fin materials (e.g., Si:SiGe selectivity) and the micro-loading effects that result in the upper lateral surfaces of the vertical semiconductor fins 122 and 160 etching at a faster rate than the vertical (sloped) sidewalls of the semiconductor fins 122 and 160 during the semiconductor fin trimming process.

Figure 11:
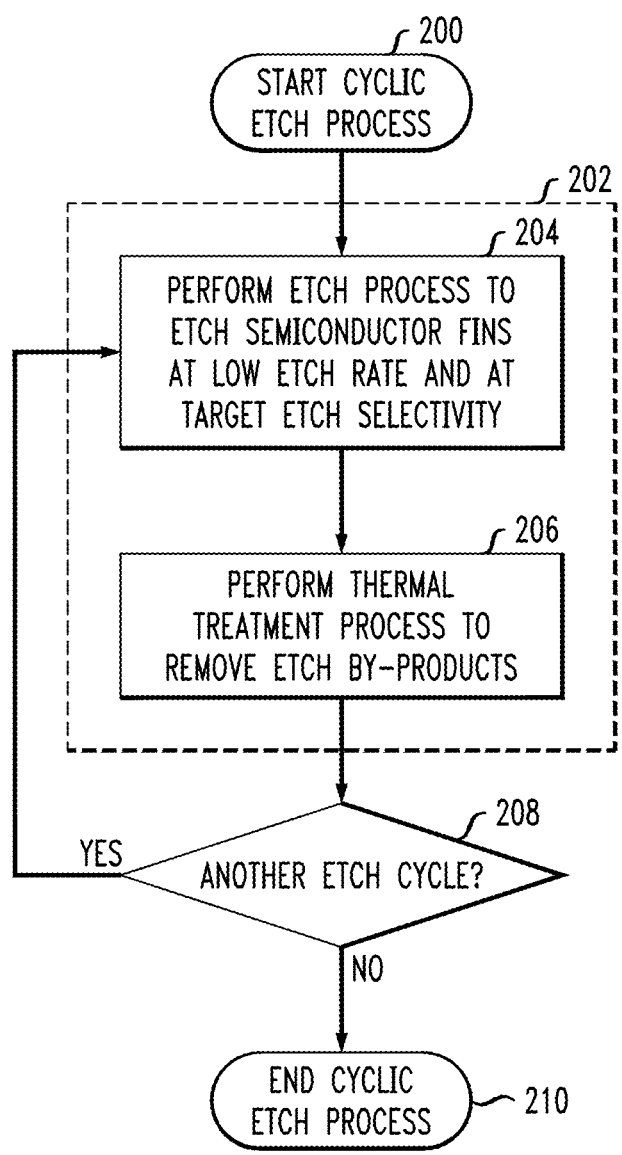
FIG. 11. is a flow diagram of a cyclic etch process that is performed to trim the semiconductor fins and obtain a uniform semiconductor fin profile across the first and second device regions, according to an embodiment of the invention.

In one embodiment, the vertical semiconductor fins 122 and 160 can be trimmed using a cyclic etch process, as shown in FIG. 11. In particular, FIG. 11. is a flow diagram of a cyclic etch process that is performed to trim the semiconductor fins and obtain a uniform semiconductor fin profile across the device regions D1 and D2, according to an embodiment of the invention. The cyclic etch process is commenced (200) subsequent to forming the intermediate structure shown in FIG. 9. In one embodiment, the cyclic etch process comprises performing two or more instances of an etch cycle (202) to incrementally etch the vertical semiconductor fins 122 and 160 until a uniform semiconductor fin profile is obtained as shown in FIG. 10. In another embodiment, a trim process implements a single etch cycle (202) to trim the semiconductor fins 122 and 160 to the target uniform fin profile. The etch cycle (202) comprises an etch process (204) to at least partially etch down a portion of the vertical semiconductor fins 122 and 160, followed by a thermal treatment (206) to remove by-products of the etch process for the given etch cycle.

In one embodiment, the etch process (204) is performed using an etch chemistry and etch environment in which the semiconductor material (e.g., SiGe) of the semiconductor fins 122 is etched selective to the semiconductor material (e.g., Si) of the semiconductor fins 160, and wherein selective etching is performed at a relatively low etch rate. For example, in one embodiment of the invention, the etch process (204) is performed with a SiGe:Si etch selectivity in a range of greater than 1:1 to about 3:1, and at an etch rate of about one angstrom (Å)/sec. The target etch rate of 1 Å/sec can be obtained by using a diluted reaction gas at an optimized chamber pressure.

The thermal treatment (206) process is performed to remove a layer of etch by-products which is formed as a result of the semiconductor fin etch process, and which inhibits or otherwise prevents the reaction gases from diffusing through the by-product layer to reach the target semiconductor fin material. The implementation of a thermal treatment between the etch cycles to remove the by-product layer enables the use of diluted reaction gases to etch the semiconductor fins at a slow etch rate at 1 Å/s. In this regard, the etch cycle (202) provides a balance between the amount of etch by-products that are formed and the ability of the etch chemistry to diffuse through the etch by-product layer and reach the semiconductor material of the semiconductor fins 122 and 160.

In addition, the process time of the etch process (204) is selected based on factors including, but not limited to, a "saturation time" of the semiconductor fin etch process and an "incubation period" of the materials that are subjected to the etch chemistry during the etch process, as is understood by those of ordinary skill in the art. The "saturation time" of the etch process refers to the period of process time at which the given etch chemistry for a target material can no longer effectively etch the target material. The "incubation period" for etching a given material refers to the period of time that elapses between the start of the etch process and the time when the given material starts to be etched by the given etch chemistry. For example, for a given etch process (204), the etch chemistry and environment can be configured such that the etching of the Si material of the vertical semiconductor fins 160 (and the underlying substrate 110) begins at some after the etching begins for the SiGe material of the vertical semiconductor 122.

In one embodiment, the etch cycle (202) is repeated multiple times (208) to incrementally trim the semiconductor fins 122 and 160 until a uniform fin profile is obtained as shown in FIG. 10, in which case no further etch cycle is performed (208), and the cyclic etch process is ended (210). The number of times in which the etch cycle (202) is performed will vary depending on factors including, but not limited to, the target width W3 and height H3 of the semiconductor fins 122 and 160, and the amount of semiconductor fin material that is etched away in each cycle for a given combination of (i) process time, (ii) etch chemistry, and (iii) etch environment.

In one embodiment of the invention, a cyclic etch process can be implemented based on various process parameters as illustrated in the following table.

| CYCLIC ETCH PROCESS PARAMETERS | |
|---|---|
| Etch Process Time | up to 100 seconds |
| # Process Cycles | One or More |
| Chamber Pressure | 1000-5000 mTorr |
| Carrier Gas (e.g., $N_2$) Flow Rate | 100-1000 sccm |
| Carrier Gas (e.g. Ar) Flow Rate | 100-1000 sccm |
| Reaction Gas (e.g. $F_2$) Flow Rate | 10-200 sccm |
| Reaction Gas (e.g. $NH_3$) Flow Rate | 10-200 sccm |
| Etch Temperature | 30-100° C. |
| Thermal Anneal Process Time | 1-10 min |
| Thermal Anneal Temperature | 150-250° C. |
| Thermal Anneal Pressure | 1000-2000 mTorr |
| Thermal Anneal Gas (e.g., $N_2$) Flow Rate | 1000-2000 sccm |

The etch process parameters (e.g., etch process time, # cycles, chamber pressure, carrier gases, reaction gases, flow rates of the carrier and reaction gates, etch temperature, etc.) shown in the above table provide exemplary parameters which can be utilised/adjusted to tailor the semiconductor fin trimming process (in block 204, FIG. 11) to provide a target etch rate and target etch selectivity (e.g., SiGe to Si etch selectivity). In addition, the thermal anneal treatment process parameters (e.g., thermal anneal process time, and thermal anneal temperature, pressure, and reaction gas) shown in the above table provide example parameters which can be implemented to perform a thermal treatment (in block 206, FIG. 11) to remove etch by-products that are generated from each incremental etch process. The etch selectivity between SiGe and Si, for example, can be tuned by adjusting the partial pressures of the $NH_3/F_2$ reaction gases. The reaction gases are diluted using a carrier gas, such as Ar (Argon) or $N_2$ (nitrogen), or mixtures thereof, wherein the carrier gas is introduced into the process chamber at a flow rate of about 100 sccm to about 1000 sccm. In one embodiment of the invention, the ratio of the carrier gas to reaction gas is set to about 20:1 or greater to achieve a slow etch rate. As noted above, under etch conditions in which the reaction gases are significantly diluted, and where the etch process is performed at an optimal chamber pressure, a relatively low etch rate of 1 Å/sec or less can be achieved.

Following the formation of the intermediate structure shown in FIG. 10, any suitable sequence of FEOL process modules may be implemented to form gate structures and source/drain regions for the FinFET devices (and other active devices and components). The FEOL fabrication process is followed by MOL (middle of the line) process modules to, e.g., form a PMD (pre-metal dielectric layer) with vertical device contacts to the source/drain regions and gate structures (and other active devices and components). The MOL fabrication process is followed by BEOL (back-end-of-line) process modules to form an interconnect structure with multiple levels of wiring and vertical vias to provide connections between the FinFET devices and other active or passive devices that are formed as part of the FEOL layer.

It is to be understood that the methods discussed herein for fabricating uniform profile semiconductor fins for FinFET devices can be incorporated as part of various semiconductor processing flows for fabricating other types of semiconductor devices and integrated circuits with various analog and digital circuitry or mixed-signal circuitry. The integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A method for fabricating a semiconductor device, comprising:
   forming a plurality of semiconductor fins on a substrate, wherein the plurality of semiconductor fins comprises a first semiconductor fin disposed in a first device region, and a second semiconductor fin disposed in a second device region, wherein the first and second semiconductor fins are formed of different types of semiconductor material, wherein the first semiconductor fin and the second semiconductor fin are formed to have different widths and heights; and
   performing a semiconductor fin trimming process, which is selective to the semiconductor material of the second semiconductor fin, to trim the first and second semiconductor fins to have substantially a same width and substantially a same height,
   wherein performing the semiconductor fin trimming process comprises performing a cyclic etch process to incrementally etch the first and second semiconductor fins, wherein the cyclic etch process comprises sequentially performing at least two instances of an etch cycle, wherein the etch cycle comprises:
   performing an etch process to partially etch the first and second semiconductor fins using an etch chemistry and environment which is configured to etch the semiconductor material of the second semiconductor fin selective to the semiconductor material of the first semiconductor fin; and
   performing a thermal treatment to remove by-products of the etch process.

2. The method of claim 1, wherein the first semiconductor fin is formed of crystalline silicon and wherein the second semiconductor fin is formed of silicon germanium.

3. The method of claim 1, wherein prior to performing the fin trimming process, the first semiconductor fin comprises a width W1 and a height H1, and the second semiconductor fin comprises a width W2 and a height H2, wherein W1 is less than W2, and wherein H1 is less than H2.

4. The method of claim 3, wherein the first and second semiconductor fins are trimmed to have substantially a same width W3 and substantially a same height H3, wherein W3 is less than 7 nm, and wherein H3 is 100 nm or less.

5. The method of claim 3, wherein a width differential W2−W1 is in a range of about 1 nm to about 3 nm, and wherein a height differential H2−H1 is in a range of about 5 nm to about 10 nm.

6. The method of claim 3, wherein W1 is in a range of about 6 nm to about 10 nm, and wherein W2 is in a range of about 8 nm to about 15 nm.

7. The method of claim 1, wherein the etch process is performed with an etch rate of about 1 angstroms/second.

8. The method of claim 1, wherein the etch chemistry and environment comprises reaction gases and a carrier gas, wherein a ratio of the carrier gas to the reaction gases is about 20:1 or greater.

9. The method of claim 8, wherein the reaction gases comprise a mixture of fluorine ($F_2$) and ammonia ($NH_3$), wherein a ratio of the reaction gases is adjusted to tune an etch selectivity of the etch process.

10. A method for fabricating a semiconductor device, comprising:
    patterning a layer of first epitaxial semiconductor material, which is disposed on a semiconductor substrate, to form a trench opening in the layer of first epitaxial semiconductor layer down to the semiconductor substrate, wherein the trench opening is formed in a first device region;
    forming a first semiconductor fin in the trench opening, wherein the first semiconductor fin is formed of a second epitaxial semiconductor material which is different from the first epitaxial semiconductor material, wherein the first semiconductor fin is epitaxially grown in the trench opening using a bottom-up epitaxial growth process to partially fill the trench opening with the second epitaxial semiconductor material to a height of H1 which is less than a thickness T of the layer of first epitaxial semiconductor material, wherein a width of the trench opening defines a width W1 of the first semiconductor fin;
    etching the layer of first epitaxial semiconductor material to form a second semiconductor fin in a second device region which comprises the first epitaxial semiconductor material, and to remove remaining portions of the layer of first epitaxial semiconductor material in the first and second device regions, wherein the second semiconductor fin is formed to have a width W2 which is greater than W1, and wherein a height H2 of the second semiconductor fin is defined by the thickness T of the layer of first epitaxial semiconductor material; and
    performing a semiconductor fin trimming process, which is selective to the first epitaxial semiconductor material of the second semiconductor fin, to trim the first and second semiconductor fins to have substantially a same width W3 and substantially a same height H3, wherein W3 is less than W2 and W1, and wherein H3 is less than H2 and H1.

11. The method of claim 10, wherein the first epitaxial semiconductor material comprises crystalline silicon germanium, and wherein the second epitaxial semiconductor material comprises crystalline silicon.

12. The method of claim 10, wherein W1 is in a range of about 6 nm to about 10 nm, and wherein W2 is in a range of about 8 nm to about 15 nm.

13. The method of claim 10, wherein a width differential W2−W1 is in a range of about 1 nm to about 3 nm, and wherein a height differential H2−H1 is in a range of about 5 nm to about 10 nm.

14. The method of claim 10, wherein W3 is less than 7 nm, and wherein H3 is 100 nm or less.

15. The method of claim 10, wherein patterning the layer of first epitaxial semiconductor material to form the trench opening comprises:
    forming a semiconductor fin pattern image over the layer of first epitaxial semiconductor material, wherein the semiconductor fin pattern image comprises a first feature disposed in the first device region, and a second feature disposed in the second device region, wherein the first feature comprises a width that defines the width W1 of the first semiconductor fin, and wherein the second feature comprises a width that defines the width W2 of the second semiconductor fin;
    filling spaces surrounding the first and second features of the semiconductor fin pattern image with insulating fill material that has etch selectivity with regard to the first and second features of the semiconductor fin pattern image;
    etching away the first feature of the semiconductor fin pattern image selective to the insulating fill material to form an opening that exposes a portion of the layer of first epitaxial semiconductor material; and
    etching the exposed portion of the layer of first epitaxial semiconductor material to form the trench opening in which the first semiconductor fin is formed.

16. The method of claim 15, wherein etching the layer of first epitaxial semiconductor material to form the second semiconductor fin in the second device region and to remove the remaining portions of the layer of first epitaxial semiconductor material in the first and second device regions, comprises:
    etching away the insulating fill material selective to the second feature of the semiconductor fin pattern image; and
    etching away the exposed portions of the layer of first epitaxial semiconductor which are not covered by the second feature;
    wherein the portion of the layer of first epitaxial semiconductor which is covered by the second feature forms the second semiconductor fin.

17. The method of claim 10, wherein performing a semiconductor fin trimming process comprises performing a cyclic etch process to incrementally etch the first and second semiconductor fins, wherein the cyclic etch process comprises sequentially performing at least two instances of an etch cycle, wherein the etch cycle comprises:
    performing an etch process to partially etch the first and second semiconductor fins using an etch chemistry and environment which is configured to etch the epitaxial semiconductor material of the second semiconductor fin selective to the epitaxial semiconductor material of the first semiconductor fin;
    performing a thermal treatment to remove by-products of the etch process.

18. The method of claim 17, wherein the etch process is performed with an etch rate of about 1 angstroms/second.

19. The method of claim 17, wherein the etch chemistry and environment comprises reaction gases and a carrier gas, wherein a ratio of the carrier gas to the reaction gases is about 20:1 or greater, wherein the reaction gases comprise a mixture of fluorine (F2) and ammonia ($NH_3$), wherein a ratio of the reaction gases is adjusted to tune an etch selectivity of the etch process.

* * * * *